United States Patent
Kao et al.

(10) Patent No.: US 11,664,216 B2
(45) Date of Patent: May 30, 2023

(54) ALD PROCESS AND HARDWARE WITH IMPROVED PURGE EFFICIENCY

(71) Applicant: Applied Materials, Inc., Santa Clara, CA (US)

(72) Inventors: Chien-Teh Kao, Sunnyvale, CA (US); Xiangxin Rui, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 304 days.

(21) Appl. No.: 17/182,555

(22) Filed: Feb. 23, 2021

(65) Prior Publication Data
US 2021/0202234 A1 Jul. 1, 2021

Related U.S. Application Data

(62) Division of application No. 16/229,754, filed on Dec. 21, 2018, now Pat. No. 10,964,533.

(51) Int. Cl.
*C23C 16/455* (2006.01)
*H01L 21/02* (2006.01)
(Continued)

(52) U.S. Cl.
CPC ............ *H01L 21/0228* (2013.01); *B05D 1/60* (2013.01); *C23C 16/4412* (2013.01); *C23C 16/45527* (2013.01); *H10N 70/023* (2023.02)

(58) Field of Classification Search
CPC ... H01L 21/0228; B05D 1/60; C23C 16/4412; C23C 16/45527; C23C 16/4408;
(Continued)

(56) References Cited

U.S. PATENT DOCUMENTS 6,461,436 B1 10/2002 Campbell et al.
2002/0197402 A1 12/2002 Chiang et al.
(Continued)

FOREIGN PATENT DOCUMENTS

JP  2017-133067 A  8/2017
KR  2014-0076796 A  6/2014
(Continued)

OTHER PUBLICATIONS

PCT Notification of Transmittal of the International Search Report and the Written Opinion of the International Searching Authority for International Application No. PCT/US2019/054511; dated Oct. 3, 2019.

*Primary Examiner* — Katherine A Bareford
*Assistant Examiner* — Christina D McClure
(74) *Attorney, Agent, or Firm* — Patterson + Sheridan, LLP

(57) ABSTRACT

Embodiments described herein provide a gas supply system for reducing purge time and increasing processing throughput, and an atomic layer deposition (ALD) chamber having the same. The gas supply system includes an inert gas line and a precursor supply line. The inert gas line is configured to be coupled to an inlet of the chamber separate from the precursor supply line. Therefore, the inert gas is supplied concurrently to the precursor supply line and the processing region of the chamber such that total purge time is reduced. The reduction of the total purge time due to the gas supply system increases purge efficiency and increases processing throughput. Furthermore, the gas supply system allows inert gas to be utilized as a dilution gas during flow of precursors.

20 Claims, 6 Drawing Sheets

(51) Int. Cl.
*C23C 16/44* (2006.01)
*B05D 1/00* (2006.01)

(58) Field of Classification Search
CPC ........ C23C 16/45502; C23C 16/45563; C23C 16/45544; H01N 70/023
See application file for complete search history.

(56) References Cited

U.S. PATENT DOCUMENTS

| | | |
|---|---|---|
| 2004/0129219 A1 | 7/2004 | Doan et al. |
| 2006/0225657 A1* | 10/2006 | Mizushima ........... C23C 16/403 |
| | | 118/724 |
| 2009/0061640 A1* | 3/2009 | Wong ................ H01J 37/32449 |
| | | 156/345.26 |
| 2016/0268107 A1* | 9/2016 | White ............... H01J 37/32513 |

FOREIGN PATENT DOCUMENTS

| | | |
|---|---|---|
| WO | 03/035927 A2 | 5/2003 |
| WO | 2017-153638 A1 | 9/2017 |
| WO | 2018-109553 A2 | 6/2018 |

* cited by examiner

ALD PROCESS AND HARDWARE WITH IMPROVED PURGE EFFICIENCY

CROSS REFERENCE TO RELATED APPLICATIONS

This application is a divisional of U.S. application Ser. No. 16/229,754, filed Jan. 21, 2018, which is hereby incorporated by reference in its entirety.

BACKGROUND

Field

Embodiments of the present disclosure generally relate to a gas supply system for reducing purge time and increasing processing throughput, and an atomic layer deposition (ALD) chamber having the same.

Description of the Related Art

ALD is based upon atomic layer epitaxy (ALE) and employs chemisorption techniques to deliver precursor molecules on a surface in sequential cycles. The substrate is disposed in a processing region of an ALD chamber. A first precursor flows into the processing region across the substrate and is exhausted from the processing region. Then, a second precursor flows into the processing region across the substrate and is exhausted from the processing region. The first and second precursors react to form a product compound as a film on the substrate surface. The cycle is repeated to form the layer to a desired thickness.

A purge gas may be introduced between introductions of the precursors. As the deposition rate of each cycle is fixed, the purge efficiency factors into cycle time, and thus controls processing throughput. Accordingly, what is needed in the art is a gas supply system for reducing purge time and increasing processing throughput, and an ALD chamber having the same.

SUMMARY

In one embodiment, a chamber is provided. The chamber includes a chamber body and a lid assembly. The lid assembly includes a chamber inlet having an inert gas opening and a precursor opening, a chamber outlet in fluid communication with a chamber pump, and a process kit. The process kit includes a process kit inlet coupled to the chamber inlet and a process kit outlet coupled to the chamber outlet. A pedestal is disposed in the chamber body. The pedestal includes a processing position that contacts the process kit forming a processing region in fluid communication with the process kit inlet and the process kit outlet. The chamber includes a gas supply system. The gas supply system has an inert gas line and a precursor supply line. The inert gas line includes an inert gas line outlet coupled to the inert gas opening of the chamber inlet, and an inert gas valve disposed between the inert gas line and an inert gas source. The precursor supply line includes a precursor outlet, a first precursor inlet, a second precursor inlet, and a purge outlet. The precursor outlet is coupled to the precursor opening of the chamber inlet. The first precursor inlet is in fluid communication with a first precursor line. The first precursor line is coupled to a first precursor source and includes a first precursor valve. The second precursor inlet is in fluid communication with a second precursor line. The second precursor line is coupled to a second precursor source and includes a second precursor valve. The purge outlet is in fluid communication with a purge line. The purge line is coupled to a gas supply system pump and includes a purge valve.

In another embodiment, a chamber is provided. The chamber includes a chamber body and a lid assembly. The lid assembly includes a chamber inlet having an inert gas opening and a precursor opening, a chamber outlet in fluid communication with a chamber pump, and a process kit. The process kit includes a process kit inlet coupled to the chamber inlet and a process kit outlet coupled to the chamber outlet. The process kit inlet includes a flow guide with a diffuser disposed at an outlet of the flow guide. The flow guide has a flow guide inlet in fluid communication with the chamber inlet, a recess disposed between a upper member and a lower member of the flow guide, the recess having a plurality of channels, a plenum disposed between a flow modulator and the flow guide inlet. A pedestal is disposed in the chamber body. The pedestal includes a processing position that contacts the process kit forming a processing region in fluid communication with the process kit inlet and the process kit outlet. The chamber includes a gas supply system. The gas supply system has an inert gas line and a precursor supply line. The inert gas line includes an inert gas line outlet coupled to the inert gas opening of the chamber inlet, and an inert gas valve disposed between the inert gas line and an inert gas source. The precursor supply line includes a precursor outlet, a first precursor inlet, a second precursor inlet, and a purge outlet. The precursor outlet is coupled to the precursor opening of the chamber inlet. The first precursor inlet is in fluid communication with a first precursor line. The first precursor line is coupled to a first precursor source and includes a first precursor valve. The second precursor inlet is in fluid communication with a second precursor line. The second precursor line is coupled to a second precursor source and includes a second precursor valve. The purge outlet is in fluid communication with a purge line. The purge line is coupled to a gas supply system pump and includes a purge valve.

In yet another embodiment, a method of forming a film is provided. The method includes purging a processing region of a chamber and a precursor supply line of a gas supply system coupled to an inlet of the processing region of the chamber. The gas supply system includes an inert gas line and a precursor supply line. The inert gas line has an outlet coupled to the inlet, and an inert gas valve disposed between the inert gas line and an inert gas source. The precursor supply line includes a precursor outlet, a first precursor inlet, a second precursor inlet, and a purge outlet. The precursor outlet is coupled to a chamber inlet of the chamber. The first precursor inlet is in fluid communication with a first precursor line. The first precursor line is coupled to a first precursor source and includes a first precursor valve. The second precursor inlet is in fluid communication with a second precursor line. The second precursor line is coupled to a second precursor source and includes a second precursor valve. The purge outlet is in fluid communication with a purge line. The purge line is coupled to a gas supply system pump and includes a purge valve. The purging the processing region and the precursor supply line includes positioning the inert gas valve in an open state to flow an inert gas into the inlet, and positioning the purge valve in the open state and the first precursor valve and the second precursor valve in a closed state to flow a portion of the inert gas in the inlet through the precursor supply line and the purge line, and exhaust the portion of the inert gas with the gas supply system pump.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
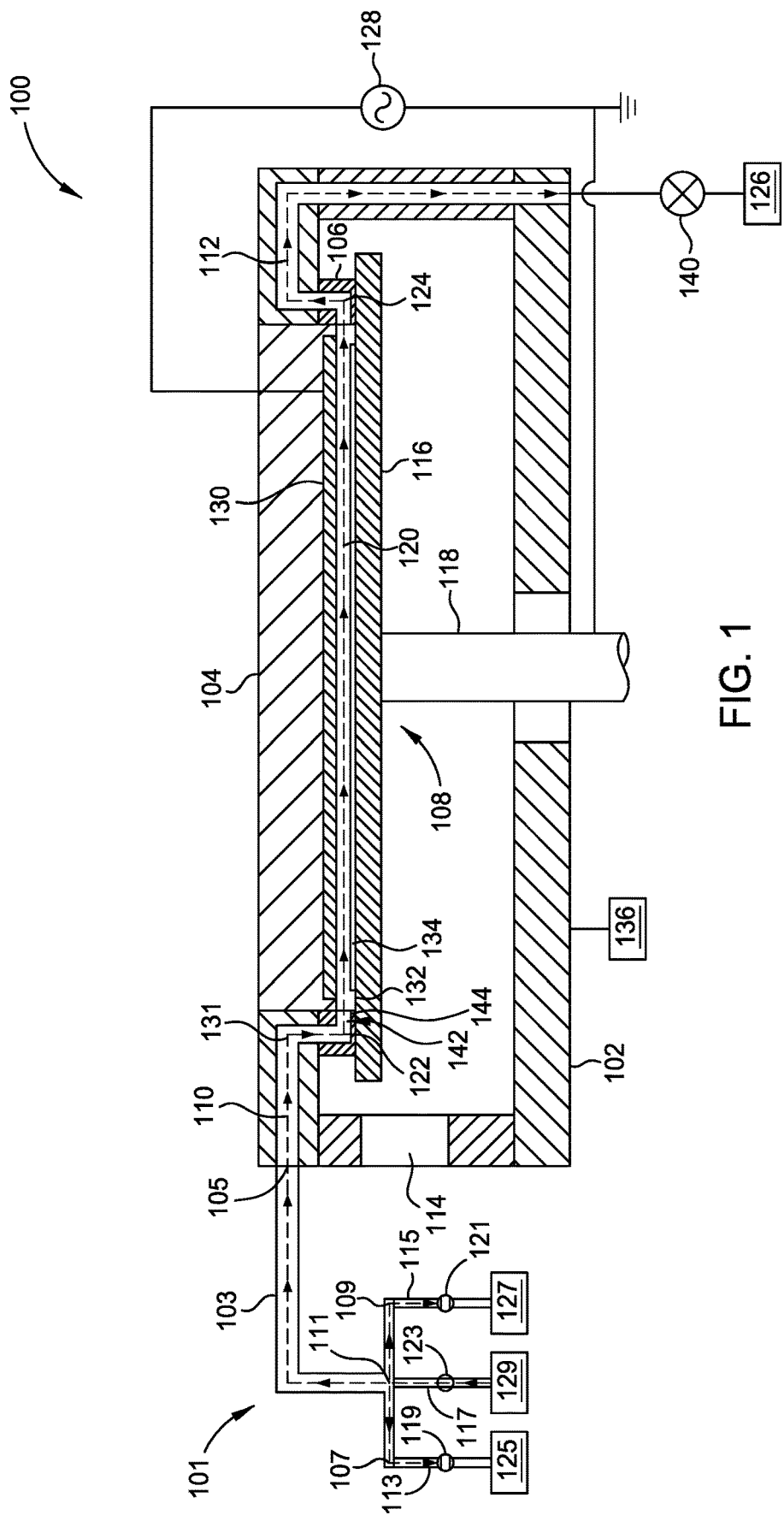
FIG. 1 is a schematic cross-sectional view of an atomic layer deposition (ALD) chamber having a gas supply system according to an embodiment.

Embodiments described herein provide a gas supply system for reducing purge time and increasing processing throughput, and an atomic layer deposition (ALD) chamber having the same. FIG. 1 is a schematic cross-sectional view of an ALD chamber 100 having a gas supply system 101. Suitable ALD chambers may be obtained from Applied Materials, Inc. located in Santa Clara, Calif. It is to be understood that the system described below is an exemplary chamber and other chambers, including chambers from other manufacturers, may be used with or modified to accomplish aspects of the present disclosure. The ALD chamber 100 includes a chamber body 102, a lid assembly 104, a process kit 106, and a substrate support assembly 108.

The lid assembly 104 is disposed at an upper end of the chamber body 102, and the substrate support assembly 108 is at least partially disposed within the chamber body 102. The lid assembly 104 includes a chamber inlet 110 of the gas supply system 101 and a chamber outlet 112. The process kit 106 is coupled to the lid assembly 104. The substrate support assembly 108 includes a pedestal 116 movably disposed in the chamber body 102 by a stem 118. The pedestal 116 includes a substrate support surface 132 configured to support a substrate 134. The stem 118 extends through the chamber body 102 where stem 118 is connected to a lift system (not shown) that moves the pedestal 116 between a processing position (as shown) and a transfer position. The transfer position facilitates transfer of the substrate 134 through a slit valve opening 114 formed in a sidewall of the chamber body 102 to provide access to the interior of the ALD chamber 100.

In the processing position, the substrate support assembly 108 contacts the process kit 106 to form a processing region 120 defined by the substrate support surface 132, the process kit 106, and the lower surface of the lid assembly 104. When the substrate support assembly 108 in the processing position contacts the process kit 106 to form a processing region 120. The process kit inlet 122 is coupled to the chamber inlet 110 and a process kit outlet 124 is coupled to the chamber outlet 112. In the processing position, the chamber inlet 110, the process kit inlet 122, the processing region 120, the process kit outlet 124, and the chamber outlet 112 are positioned to be in fluid communication. In this manner, the gas is provided to the chamber inlet 110 and to the processing region 120 through the process kit inlet 122.

The chamber outlet 112 is in fluid communication with a pump 126. A pressure controller 140, such as a Throttle valve (TV) device, is disposed between the chamber outlet 112 and the pump 126. In one embodiment that may be combined with other embodiments described herein, the pump 126 is coupled to the chamber outlet 112 disposed in the lid assembly 104. In another embodiment that may be combined with other embodiments described herein, the chamber outlet 112 is disposed in the lid assembly 104 and the chamber body 102, and the pump 126 is coupled to the chamber outlet 112 disposed in the chamber body 102.

The gas flow in the processing region 120 across the substrate 134 and are exhausted through the process kit outlet 124 and chamber outlet 112 by the pump 126. The pressure controller 140 is controlling a rate the gas is exhausted from the processing region 120. An RF (radio frequency) source 128 is coupled an electrode 130 of the lid assembly 104. The RF source 128 powers the electrode 130 to facilitate generation of plasma from the gas in the processing region 120. The pedestal 116 is grounded or the pedestal 116 may serve as a cathode when connected to the RF source 128 to generate a capacitive electric field between the lower surface of the lid assembly 104 and the pedestal 116 to generate reactive plasma species for depositing films on the substrate 134. In embodiments that may be combined with other embodiments described herein, the process kit inlet 122 includes a flow guide 142 with a diffuser 144 disposed at the outlet of the flow guide 142. The flow guide 142 with the diffuser 144 provides a flow path for substantially uniform distribution of gas across the processing region 120. However, the diffuser 144 restricts the flow rate of gas across the flow guide 142 resulting in deceased purge efficiency in ALD processes described herein.

Figure 2A:
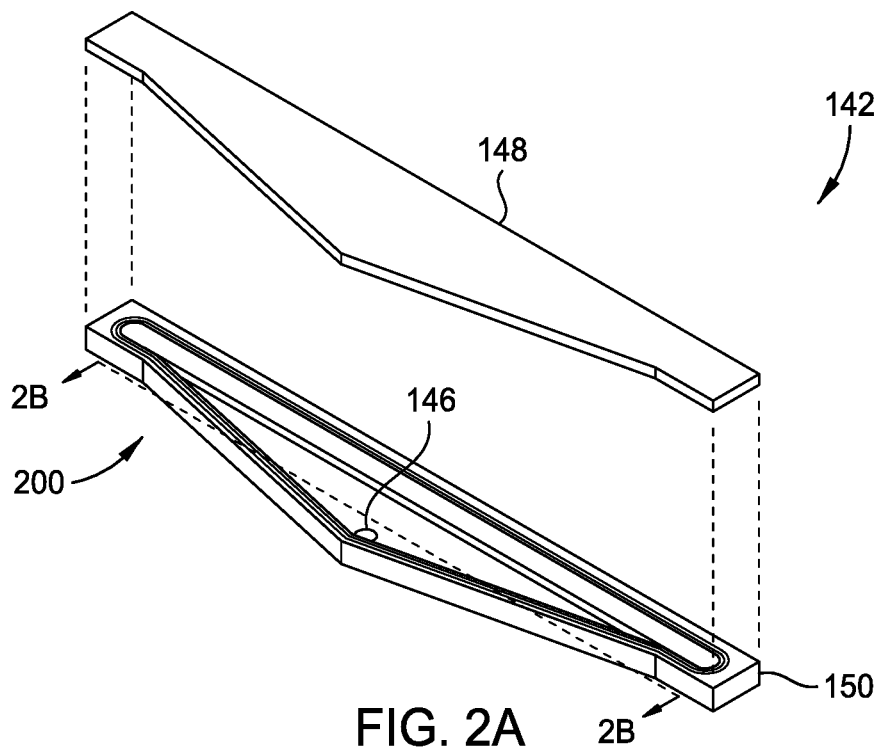
FIG. 2A is an isometric view of a flow guide having a first configuration according to an embodiment.
Figure 2B:
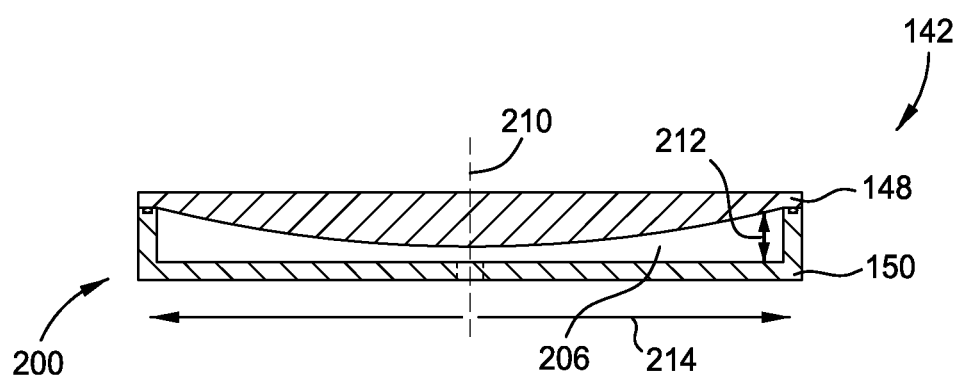
FIG. 2B is a cross section of a flow guide having a first configuration according to an embodiment.

FIG. 2A is an isometric view of the flow guide 142 having a first configuration 200. FIG. 2B is a cross section of the flow guide 142 having the first configuration 200 along the section line indicated in FIG. 2A with an upper member 148 coupled to the lower member 150. The flow guide 142 having the first configuration 200 is formed from an upper member 148 and a lower member 150. The flow guide 142 having the first configuration 200 includes a flow guide inlet 146 in fluid communication with the chamber inlet 110. A recess 206 is formed in the lower member 150. When the upper member 148 and the lower member 150 are coupled, a recess 206 is formed. The flow guide 142 having the first configuration 200 has a height 212 of the recess 206. As a distance 214 from a center line 210 of the flow guide inlet 146 increases, the height 212 of the recess 206 increases. The flow guide 142 having the first configuration 200 provides the flow path for substantially uniform distribution of gas across the processing region 120.

Figures 3A, 3B:
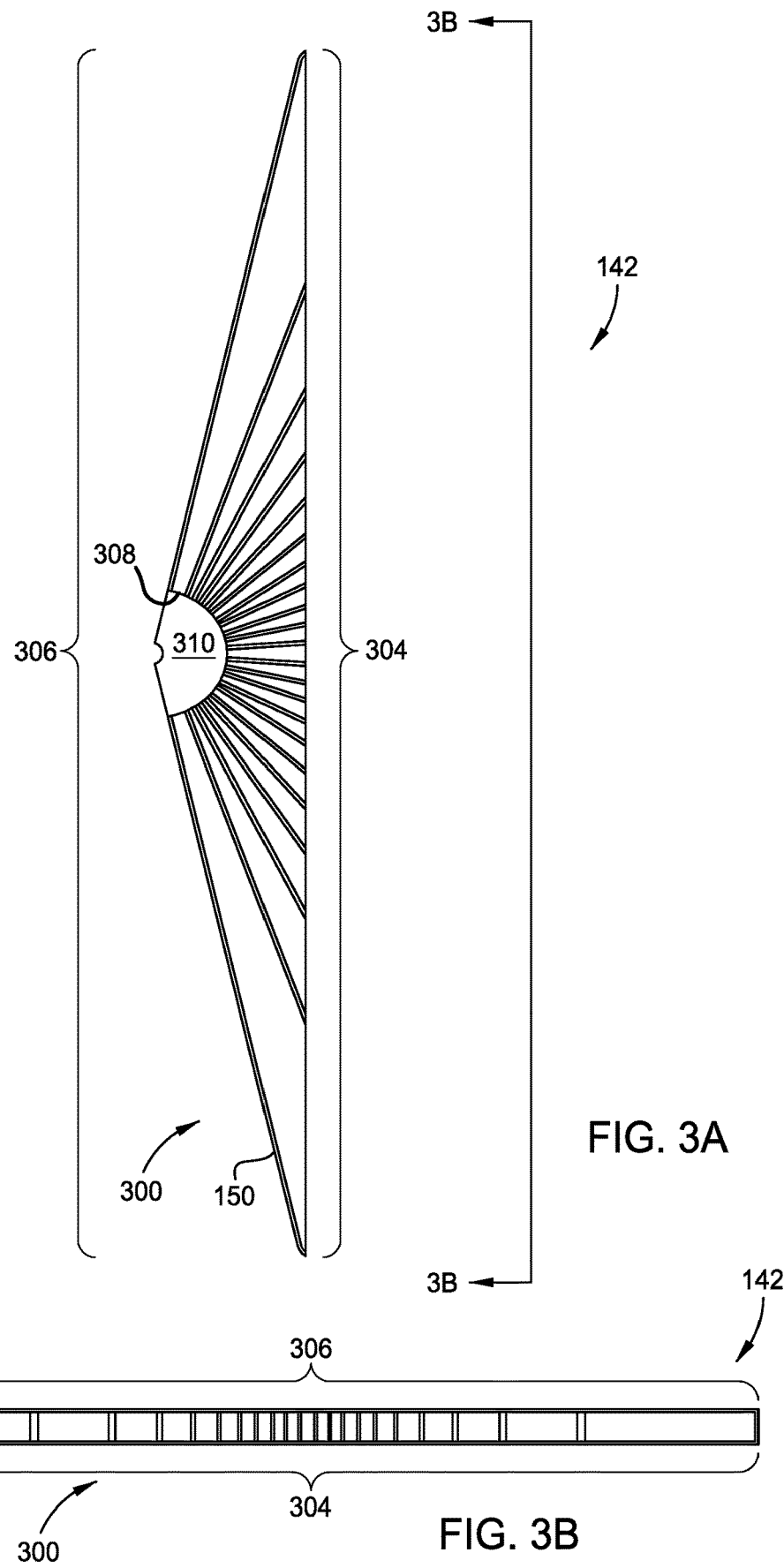
FIG. 3A is a schematic top view of a flow guide having a second configuration according to an embodiment.
FIG. 3B is a schematic side view of a flow guide having a second configuration according to an embodiment.

FIG. 3A is a schematic top view and FIG. 3B is a schematic side view of the flow guide 142 having a second configuration 300. The flow guide 142 having the second configuration 300 is formed from the upper member 148 and the lower member 150. The flow guide 142 having the second configuration 300 includes the flow guide inlet 146 in fluid communication with the chamber inlet 110. When the upper member 148 and the lower member 150 are coupled, a recess 306 is formed. The recess 306 includes a plurality of channels 304. A plenum 310 is formed between a flow modulator 308 and the flow guide inlet 146. Each opening of the flow modulator 308 corresponds to a channel of the plurality of channels 304. The flow guide 142 having the second configuration 300 provides the flow path for a substantially uniform distribution of gas across the processing region 120.

Referring to FIG. 1A, the gas supply system 101 includes a gas line 103 having an outlet 105, a first precursor inlet 107, a second precursor inlet 109, and an inert gas inlet 111. The outlet 105 is configured to be coupled to the chamber inlet 110 of the lid assembly 104. The first precursor inlet 107 is in fluid communication with a first precursor line 113. The first precursor line 113 is coupled to a first precursor source 125 and includes a first valve 119. The first valve 119 in an open state enabling a first precursor of the first precursor source 125 to the flow through the first precursor line 113 and the gas line 103 into the chamber inlet 110. The second precursor inlet 109 is in fluid communication with a second precursor line 115. The second precursor line 115 is coupled to a second precursor source 127 and includes a second valve 121. The second valve 121 in an open state enabling a second precursor of the second precursor source 127 to the flow through the second precursor line 115 and the gas line 103 into the chamber inlet 110. The inert gas inlet 111 is in fluid communication with an inert gas line 117. The inert gas line 117 is coupled to an inert gas source 129 and includes a third valve 123. The third valve 123 in an open state enabling an inert gas of the inert gas source 129 to the flow through the inert gas line 117 and the gas line 103 into the chamber inlet 110. In one embodiment, which can be combined with other embodiments described herein, the inert gas of the inert gas source 129 includes at least one of argon (Ar), nitrogen gas ($N_2$), and helium (He). In another embodiment, which can be combined with other embodiments described herein, the inert gas of the inert gas source 129 includes at least one of Ar, $N_2$, He, oxygen gas ($O_2$), and nitrous oxide ($N_2O$) Additionally, according to embodiments, which can be combined with other embodiments described herein, each of the first precursor source 125, the second precursor source 127, and the inert gas source 129 have mass flow controllers (not shown) to provide desired flow rates to the ALD chamber 100 during processing.

The first precursor, the second precursor, and the inert gas used for ALD depend upon the process or processes to be performed. The first precursor includes at least one of trimethylaluminium $(CH_3)3Al$ (TMA) and tetrakis ethyl methyl amino zirconium $Zr[N(CH_3)(C_2H_5)]_4$ (TEMAZ). The second precursor includes at least one of $N_2$ and $O_2$. However, the first precursor and the second precursor gases are not so limited and may include one or more additional precursors, reductants, catalysts, carrier gases, or any mixture or combination thereof. The gases are introduced into the ALD chamber 100 from one side and flow across the substrate 134. For example, gases are flowed though chamber inlet 110, the process kit inlet 122, and across the processing region 120 and are exhausted through the process kit outlet 124 and chamber outlet 112.

In an exemplary aluminum oxide ($Al_2O_3$) film forming process, a flow of TMA, i.e, the first precursor, is delivered to the processing region 120. The first valve 119 in an open state enabling the first precursor of the first precursor source 125 to the flow through the first precursor line 113 and the gas line 103 into the chamber inlet 110. The second valve 121 and the third valve 123 are in a closed state. TMA flowing across the processing region 120 flows across the substrate 134 and forms a layer of TMA on the substrate 134. A flow of oxygen-containing gas, i.e, the second precursor, is delivered to the processing region 120. The second valve 121 in an open state enabling the second precursor of the second precursor source 127 to the flow through the second precursor line 115 and the gas line 103 into the chamber inlet 110. The first valve 119 and the third valve 123 are in a closed state. The oxygen-containing gas flowing across the processing region 120 flows across the substrate 134 and is activated into a plasma to provide oxygen radicals for a reaction with the layer of TMA. In one embodiment, the oxygen-containing gas is $O_2$ or ozone ($O_3$). The oxygen radicals react with the layer of TMA on the substrate 134, forming a layer of $Al_2O_3$. Repetition of a cycle the flowing TMA, the flowing of the oxygen-containing gas, and the activating the oxygen-containing gas into a plasma to form additional layers on the substrate 134 continues until an $Al_2O_3$ film having a desired thickness is formed.

In an exemplary zirconium dioxide ($ZrO_2$) film forming process, a flow of TEMAZ, i.e, the first precursor, is delivered to the processing region 120. The first valve 119 in an open state enabling the first precursor of the first precursor source 125 to the flow through the first precursor line 113 and the gas line 103 into the chamber inlet 110. The second valve 121 and third valve 123 are in a closed state. The TEMAZ flowing across the processing region 120 flows across the substrate 134 and forms a layer of TEMAZ on the substrate 134. A flow of oxygen-containing gas, i.e, the second precursor, is delivered to the processing region 120. The second valve 121 in an open state enabling the second precursor of the second precursor source 127 to the flow through the second precursor line 115 and the gas line 103 into the chamber inlet 110. The first valve 119 and the third valve 123 are in a closed state. The oxygen-containing gas flowing across the processing region 120 flows across the substrate 134 and is activated into a plasma to provide oxygen radicals for a reaction with the layer of TEMAZ. The oxygen radicals react with the layer of TEMAZ on the substrate 134, forming a layer of $ZrO_2$ on the substrate 134. Repetition of a cycle flowing TEMAZ, the flowing $O_2$, and the activating the oxygen-containing gas into a plasma continues until a $ZrO_2$ film having a desired thickness is formed. The controller 136 is configured to control the first precursor valve, the second precursor valve, the purge valve, and the inert gas valve.

Each cycle has a fixed deposition rate. The deposition rate is fixed such that each cycle forms an atomically deposited layer. For example, the deposition rate for the exemplary zirconium dioxide (ZrO2) film forming process is about 1.1 to about 1.2 micrometers per cycle ($\mu m/cycle$). The deposition rate is fixed such that each cycle forms an atomically deposited layer. Prior to each flow of the first precursor and prior to each flow of the second precursor, a purge operation is performed. The purge operation includes delivering a flow of the inert gas to the processing region 120. The flow of the inert gas prior to the flow of the first precursor in an initial cycle purges, i.e., removes, contaminants from the processing region 120. The flow of the inert has prior to the flow of the first precursor in a subsequent cycle purges contaminants and residuals of the second precursor from the processing region 120. The flow of the inert gas prior to the flow of the second precursor, purges contaminants and residuals of the first precursor from the processing region 120.

As shown in FIG. 1, to purge the processing region 120, the third valve 123 in an open state enabling the inert gas of the inert gas source 129 to the flow through the inert gas line 117 and the gas line 103 into the chamber inlet 110. The first valve 119 and the second valve 121 are in a closed state. The inert gas flows, as shown by a flow path 131, from the inert gas source 129 through the inert gas line 117 and the gas line 103, the chamber inlet 110, the process kit inlet 122, the flow guide 142, the processing region 120, the process kit outlet 124, and the chamber outlet 112. The inert gas is exhausted by the pump 126. A portion of the inert gas flows in the first precursor line 113 and the second precursor line 115 before the first valve 119 and the second valve 121, respectively. The portion of the inert gas in the first precursor line 113 and the second precursor line 115 increases a total purge time of the purge operation.

The total purge time utilizing gas the gas supply system 101 is represented by a function, total purge time=$t_{gas\ line}+t_{processing\ region}$. $t_{gas\ line}$ is a period of time required to exhaust the inert gas from the gas line 103 and the portion of the inert gas flows in the first precursor line 113 and the second precursor line 115. $t_{processing\ region}$ is a period of time required to exhaust the inert gas from the processing region 120. As the deposition rate of each cycle is fixed, the total purge time factors into cycle time, and thus controls processing throughput. The purge efficiency, i.e., total purge time, of the gas supply system 101 is a result of the volume of the processing region 120 and volume of the gas line 103 including and the portion of the inert gas the first precursor line 113 and the second precursor line 115. Furthermore, the diffuser 144 of the flow guide 142 restricts the purge efficiency. Accordingly, a gas supply system 401 and a method 500 are utilized to increase purge efficiency and increase processing throughput.

Figure 4A:
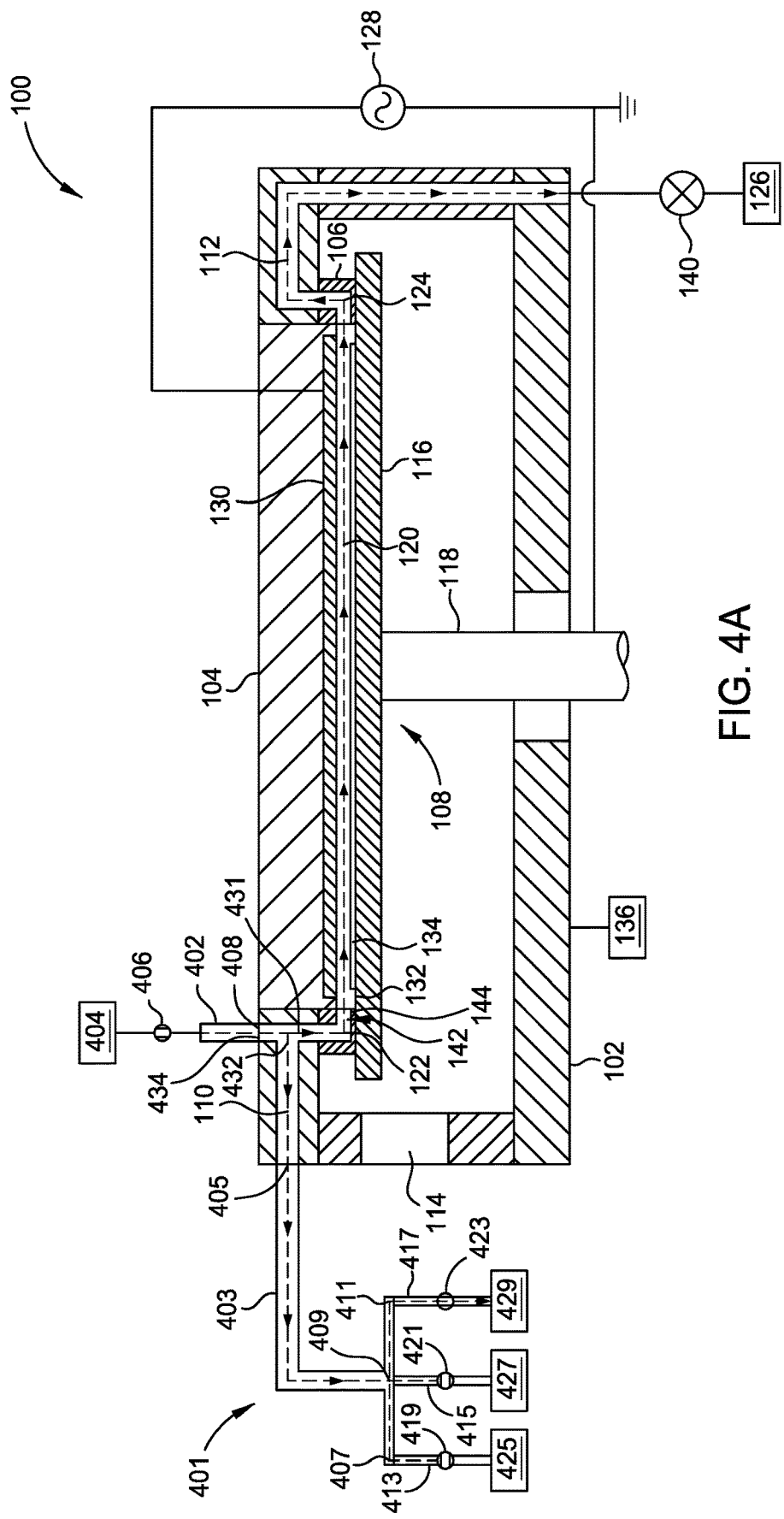
FIG. 4A is a schematic cross-sectional view of an ALD chamber having a gas supply system according to an embodiment.
Figure 4B:
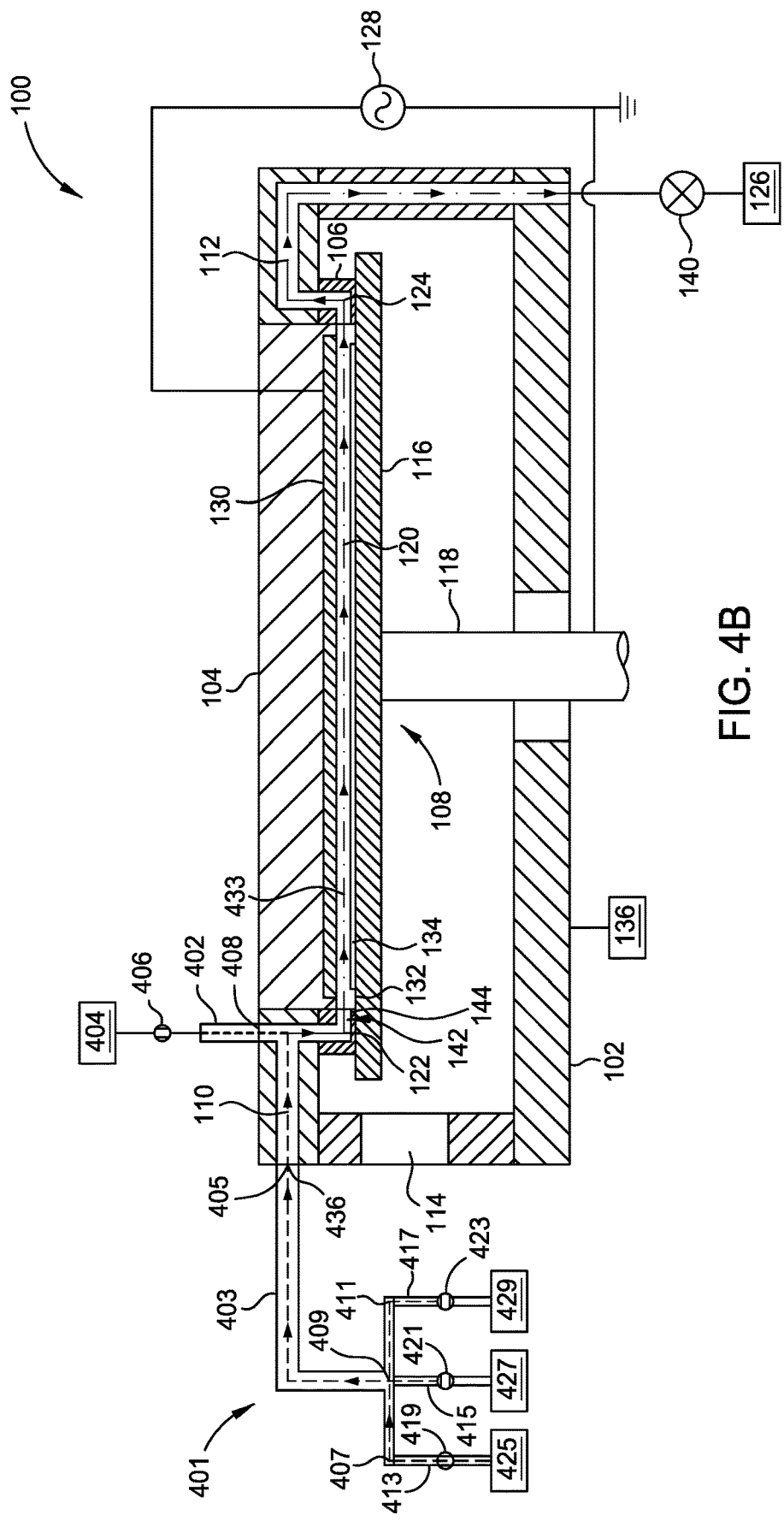
FIG. 4B is a schematic cross-sectional view of an ALD chamber having a gas supply system according to an embodiment.

FIG. 4A and FIG. 4B are schematic cross-sectional views of an ALD chamber 100 having a gas supply system 401. As shown in FIG. 4A, the gas supply system 401 is in a purge state. As shown in FIG. 4B, the gas supply system 401 is in a first precursor supply state. The gas supply system 401 includes an inert gas line 402 and a precursor supply line 403. The precursor supply line 403 includes a precursor outlet 405, a first precursor inlet 407, a second precursor inlet 409, and a purge outlet 411. The precursor outlet 405 is configured to be coupled to a precursor opening 436 the chamber inlet 110 of the lid assembly 104. The first precursor inlet 407 is in fluid communication with a first precursor line 413. The first precursor line 413 is coupled to a first precursor source 425 and includes a first precursor valve 419. The first precursor valve 419 in an open state, as shown in FIG. 4B, enables a first precursor of the first precursor source 425 to flow through the first precursor line 413 and the precursor supply line 403 into the chamber inlet 110. The second precursor inlet 409 is in fluid communication with a second precursor line 415. The second precursor line 415 is coupled to a second precursor source 427 and includes a second precursor valve 421. The second precursor valve 421 in an open state enabling a second precursor of the second precursor source 427 to flow through the second precursor line 415 and the precursor supply line 403 into the chamber inlet 110. The purge outlet 411 is in fluid communication with a purge line 417. The purge line 417 is coupled to a pump 429 and includes a purge valve 423. The purge valve 423 in an open state enabling an inert gas of the inert gas source 404 to the flow through chamber inlet 110 and the precursor supply line 403 and to be exhausted by the pump 429. The inert gas flowing through the precursor supply line 403 purges contaminants and residuals of the first and second precursors from the processing region 120.

The inert gas line 402 includes an outlet 408 configured to be coupled to an inert gas opening 434 of the chamber inlet 110 of the lid assembly 104. The inert gas line 402 is coupled to the inert gas source 404. An inert gas valve 406 is disposed between the inert gas line 402 and the inert gas source 404. The inert gas valve 406 in an open state enabling the inert gas to the flow through the precursor supply line 403 and the outlet 408 into the chamber inlet 110. Additionally, according to embodiments, which can be combined with other embodiments described herein, each of the first precursor source 425, the second precursor source 427, and the inert gas source 404 have mass flow controllers (not shown) to provide desired flow rates to the ALD chamber 100 during processing.

As shown in FIG. 4A, to purge the processing region 120, the inert gas valve 406 is in an open state enabling the inert gas of the inert gas source 404 to flow through the inert gas line 402 and the outlet 408 into the chamber inlet 110. The first precursor valve 419 and the second precursor valve 421 are in a closed state. The purge valve 423 is in an open state. The inert gas flows, as shown by the flow path 431 and the flow path 432, from the inert gas source 404 through the inert gas line 402 into the chamber inlet 110. The inert gas of the flow path 431 flows through the process kit inlet 122, the flow guide 142, the processing region 120, the process kit outlet 124, and the chamber outlet 112. The inert gas of the flow path 431 is exhausted by the pump 126. The gas supply system 401 with the purge valve 423 is in an open state provide for the inert gas of the flow path 432 to flow through chamber inlet 110 and the precursor supply line 403 and to be exhausted by the pump 429.

The total purge time utilizing gas the gas supply system 401 is represented by a function, total purge time=maximum ($t_{precursor\ supply\ line}, t_{processing\ region}$). $t_{precursor\ supply\ line}$ is a period of time required to exhaust the inert gas from precursor supply line 403. $t_{processing\ region}$ is a period of time required to exhaust the inert gas from the processing region 120. As the deposition rate of each cycle is fixed, the total purge time factors into cycle time, and thus controls processing throughput. The purge efficiency, i.e., total purge time, of the gas supply system 401 is a result of the volume of the processing region 120 and volume of the inert gas line 402. Compared to the gas line 103, the volume of the inert gas line 402 is significantly reduced. As the inert gas line 402 is configured to be coupled to the chamber inlet 110 separate from the precursor supply line 403, the inert gas is supplied concurrently to the precursor supply line 403 and the processing region 120 such that total purge time is the maximum of $t_{precursor\ supply\ line}$ and $t_{processing\ region}$. The reduction of the total purge time due to the gas supply system 401 increases purge efficiency and increases processing throughput. Furthermore, as described in the method 500, the gas supply system 401 allows the inert gas to be utilized as a dilution gas during the flow of the first precursor and the flow of the second precursor.

Figure 5:
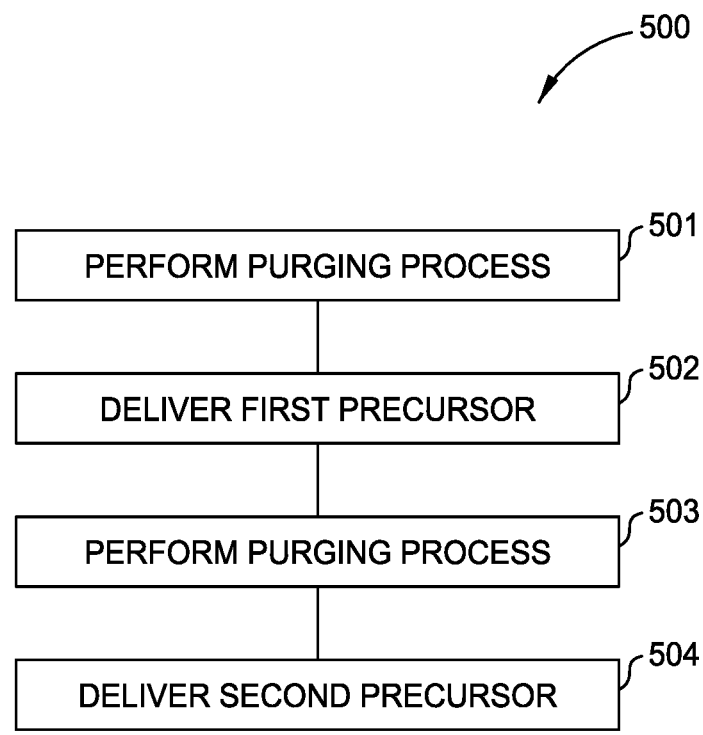
FIG. 5 is a flow diagram of a method of forming an ALD film according to an embodiment.

FIG. 5 is a flow diagram of a method 500 of forming an ALD film utilizing the gas supply system 401. At operation 501, a purging process is performed. As shown in FIG. 4A, the inert gas valve 406 is in an open state enabling the inert gas of the inert gas source 404 to flow through the inert gas line 402 and the outlet 408 into the chamber inlet 110. The first precursor valve 419 and the second precursor valve 421 are in a closed state. The purge valve 423 is in an open state. The inert gas flows from the inert gas source 404 through the inert gas line 402 into the chamber inlet 110. A portion of the inert gas has a flow path 431 through the process kit inlet 122, the flow guide 142, the processing region 120, the process kit outlet 124, and the chamber outlet 112. The inert gas of the flow path 431 is exhausted by the pump 126. Another portion of the inert gas has a flow path 432, the gas supply system 401 with the purge valve 423 is in an open state provides for the inert gas of the flow path 432 to flow through chamber inlet 110 and the precursor supply line 403 and to be exhausted by the pump 429.

At operation 502, a first precursor is delivered to the processing region 120. As shown in FIG. 4A, the first precursor valve 419 in an open state enabling a first precursor of the first precursor source 425 to the flow through the first precursor line 413 and the precursor supply line 403 into the chamber inlet 110. The second precursor valve 421 and purge valve 423 are in a closed state. The inert gas valve 406 is in an open state enabling the inert gas of the inert gas source 404 to flow through the inert gas line 402 and the outlet 408 into the chamber inlet 110. The inert gas mixes with the first precursor in the chamber inlet 110. The inert gas mixing with the first precursor dilutes the first precursor such that the first precursor is provided uniformly across the substrate 134. The diluted first precursor has a flow path 433 through the process kit inlet 122, the flow guide 142, the processing region 120, the process kit outlet 124, and the chamber outlet 112. Delivering the first precursor to the processing region 120 forms a first precursor layer on the substrate 134. At operation 503, the purging process is performed.

At operation 504, a second precursor is delivered to the processing region 120. The second precursor valve 421 in an open state enabling a second precursor of the second precursor source 427 to the flow through the second precursor line 415 and the precursor supply line 403 into the chamber inlet 110. The first precursor valve 419 and purge valve 423 are in a closed state. The inert gas valve 406 is in an open state enabling the inert gas of the inert gas source 404 to flow through the inert gas line 402 and the outlet 408 into the chamber inlet 110. The inert gas mixes with the second precursor in the chamber inlet 110. The inert gas mixing with the second precursor dilutes the second precursor such that the second precursor is provided uniformly across the substrate 134. The diluted second precursor has a flow path through the process kit inlet 122, the flow guide 142, the processing region 120, the process kit outlet 124, and the chamber outlet 112. The second precursor is activated into a plasma to provide radicals for a reaction with the layer of the first precursor. The radicals react with the layer of the first precursor on the substrate 134, forming a layer of ALD layer. Operations 501-504 are repeated to form additional ALD layers until an ALD film with a desired thickness is formed.

In summation, a gas supply system for reducing purge time and increasing processing throughput, and an atomic layer deposition (ALD) chamber having the same are provided. The utilization of the gas supply system provides of forming an ALD film with increased processing throughput due to the increase purge efficiency with the gas supply system. The purge efficiency, i.e., total purge time, of the gas supply system is a result of the volume of the processing space of the chamber and volume of the inert gas line. As the gas line of the gas supply system is configured to be coupled to the chamber inlet separate from a precursor supply line of the gas supply system, the inert gas is supplied concurrently to the precursor supply line and the processing region of the chamber such that total purge time is the maximum of $t_{precursor\ supply\ line}$ and $t_{processing\ region}$. The reduction of the total purge time due to the gas supply system increases purge efficiency and the utilization of the gas supply system during deposition provides for dilution of the precursor gas in-situ.

While the foregoing is directed to examples of the present disclosure, other and further examples of the disclosure may be devised without departing from the basic scope thereof, and the scope thereof is determined by the claims that follow.

What is claimed is:
1. A method of forming a film, comprising:
purging a processing region of a chamber and a precursor supply line of a gas supply system coupled to an inlet of the processing region of the chamber, wherein:
the gas supply system comprises:
an inert gas line, the inert gas line comprising:
an outlet coupled to the inlet; and
an inert gas valve disposed between the inert gas line and an inert gas source;
the precursor supply line, the precursor supply line comprising:
a precursor outlet, the precursor outlet coupled to a chamber inlet of the chamber;
a first precursor inlet, the first precursor inlet is in fluid communication with a first precursor line, the first precursor line is coupled to a first precursor source and includes a first precursor valve;
a second precursor inlet, the second precursor inlet is in fluid communication with a second precursor line, the second precursor line is coupled to a second precursor source and includes a second precursor valve; and
a purge outlet, the purge outlet is in fluid communication with a purge line, the purge line is coupled to a gas supply system pump and includes a purge valve; and
the purging the processing region and the precursor supply line comprises:
positioning the inert gas valve in an open state to flow an inert gas into the inlet; and
positioning the purge valve in the open state and the first precursor valve and the second precursor valve in a closed state to flow a portion of the inert gas in the inlet through the precursor supply line and the purge line, and exhaust the portion of the inert gas with the gas supply system pump.

2. The method of claim 1, further comprising,
positioning the first precursor valve in the open state and the second precursor valve and the purge valve in the closed state to flow a first precursor through the first precursor line, the precursor supply line, and into the inlet; and
positioning the inert gas valve in the open state to flow the inert gas into the inlet and dilute the first precursor in the inlet.

3. The method of claim 1, further comprising,
positioning the second precursor valve in the open state and the first precursor valve and the purge valve in the closed state to flow a second precursor through the second precursor line, the precursor supply line, and into the inlet; and positioning the inert gas valve in the open state to flow the inert gas into the inlet and dilute the second precursor in the inlet.

4. The method of claim 1, wherein the first precursor source comprises at least one of trimethylaluminium $(CH_3)_3Al$ (TMA) and tetrakis ethyl methyl amino zirconium $Zr[N(CH_3)(C_2H_5)]_4$ (TEMAZ).

5. The method of claim 1, wherein the second precursor source comprises at least one of nitrogen $(N_2)$ and oxygen $(O_2)$.

6. The method of claim 1, wherein the inert gas source includes at least one of argon (Ar), nitrogen gas $(N_2)$, helium (He), oxygen gas $(O_2)$, and nitrous oxide $(N_2O)$.

7. A method of forming a film, comprising:
performing a purging process of a chamber and a gas supply system, the purging process comprising:
flowing an inert gas through an inert gas line disposed outside of the chamber into a chamber inlet; wherein:
a first portion of the inert gas flows through the chamber inlet, a process kit inlet in fluid communication with a processing region of the chamber, and the processing region; and
a second portion of the inert gas flows through the chamber inlet, a precursor supply line, a first precursor line, and a second precursor line of the gas supply system;
flowing a first precursor through the first precursor line, the precursor supply line, the chamber inlet, and the processing region;
performing the purging process after the flowing the first precursor; and
flowing a second precursor through the second precursor line, the precursor supply line, the chamber inlet, and the processing region.

8. The method of claim 7, wherein the first precursor is flowed over a substrate disposed in the processing region to form a first precursor layer on the substrate.

9. The method of claim 8, wherein the second precursor reacts with the first precursor layer disposed on the substrate to form a layer of a film on the substrate.

10. The method of claim 9, wherein the layer of the film is a zirconium dioxide $(ZrO_2)$ material.

11. The method of claim 7, wherein the flowing the first precursor includes positioning a first precursor valve in an open state and a second precursor valve and a purge valve in a closed state to flow the first precursor through the first precursor line, the precursor supply line, and into the chamber inlet and positioning an inert gas valve in the open state to flow the inert gas into the chamber inlet and dilute the first precursor in the chamber inlet.

12. The method of claim 7, wherein the flowing the second precursor includes positioning a second precursor valve in an open state and a first precursor valve and a purge valve in a closed state to flow the second precursor through the second precursor line, the precursor supply line, and into the chamber inlet and positioning an inert gas valve in the open state to flow the inert gas into the chamber inlet and dilute the second precursor in the chamber inlet.

13. The method of claim 7, wherein the flowing the inert gas includes positioning a purge valve in an open state and a first precursor valve and a second precursor valve in a closed state to flow a portion of the inert gas in the chamber inlet through the precursor supply line and a purge line.

14. The method of claim 7, wherein the first precursor includes at least one of trimethylaluminium $(CH_3)_3Al$ (TMA) and tetrakis ethyl methyl amino zirconium $Zr[N(CH_3)(C_2H_5)]_4$ (TEMAZ).

15. The method of claim 7, wherein the second precursor includes at least one of nitrogen $(N_2)$ and oxygen $(O_2)$.

16. The method of claim 7, wherein the inert gas includes at least one of argon (Ar), nitrogen gas $(N_2)$, helium (He), oxygen gas $(O_2)$, and nitrous oxide $(N_2O)$.

17. The method of claim 7, wherein the second portion of the inert gas is exhausted from the gas supply system by a pump.

18. The method of claim 7, wherein the first portion of the inert gas exits the processing region through a chamber outlet and is exhausted from the chamber by a pump.

19. The method of claim 7, further comprising repeating the performing the purging process of the chamber and the gas supply system, the flowing the first precursor, performing the purging process after the flowing the first precursor, and the flowing the second precursor.

20. A method of forming a film, comprising:
performing a purging process of a chamber and a gas supply system, the purging process comprising:
flowing an inert gas through an inert gas line disposed outside of the chamber into a chamber inlet; wherein:
a first portion of the inert gas flows through the chamber inlet, a process kit inlet in fluid communication with a processing region of the chamber, and the processing region; and
a second portion of the inert gas flows through the chamber inlet, a precursor supply line, a first precursor line, a second precursor line of the gas supply system, and is exhausted from the gas supply system by a pump;
flowing a first precursor through the first precursor line, the precursor supply line, the chamber inlet, and the processing region;
performing the purging process after the flowing the first precursor; and
flowing a second precursor through the second precursor line, the precursor supply line, the chamber inlet, and the processing region.

* * * * *